US006864150B2

(12) United States Patent
Lin et al.

(10) Patent No.: US 6,864,150 B2
(45) Date of Patent: Mar. 8, 2005

(54) MANUFACTURING METHOD OF SHALLOW TRENCH ISOLATION

(75) Inventors: Ping-Wei Lin, hsinvhu (TW); Gwo-Chyuan Kuoh, Keelung (TW); Chao-Sheng Chiang, Hsinchu (TW)

(73) Assignee: Silicon Integrated Systems Corp., Hsinchu (TW)

( * ) Notice: Subject to any disclaimer, the term of this patent is extended or adjusted under 35 U.S.C. 154(b) by 154 days.

(21) Appl. No.: 10/384,287

(22) Filed: Mar. 6, 2003

(65) Prior Publication Data

US 2004/0175900 A1 Sep. 9, 2004

(51) Int. Cl.[7] .................................................. H01L 21/76

(52) U.S. Cl. ........................ 438/424; 438/435; 438/778; 438/786

(58) Field of Search ................................ 438/424, 435, 438/437, 778, 786

(56) References Cited

U.S. PATENT DOCUMENTS 6,383,874 B1 * 5/2002 Sun et al. ................... 438/287
6,624,068 B2 * 9/2003 Thakar et al. .............. 438/654
6,713,831 B1 * 3/2004 Sadoughi et al. ........... 257/437
6,777,336 B2 * 8/2004 Lin et al. .................... 438/691
2002/0009845 A1 * 1/2002 Bhakta et al. ............. 438/221

* cited by examiner

*Primary Examiner*—Amir Zarabian
*Assistant Examiner*—Christy Novacek
(74) *Attorney, Agent, or Firm*—Perkins Coie LLP

(57) ABSTRACT

The present invention disclosed a manufacturing method of shallow trench isolation (STI). By making use of depositing two layer of SiON with specific thickness and different extinction coefficient (k) as the ARC, comprising: (a) Depositing pad oxide/silicon nitride on a substrate as a hard mask for etching; (b) Depositing a layer of high extinction coefficient SiON on said silicon nitride, then depositing a layer of low extinction coefficient SiON as the ARC; (c) Exposing by using a STI mask and developing to form an etching mask of said STI; (d) Etching said SiON, silicon nitride, pad oxide and said substrate to form a shallow trench; (e) Growing an oxide layer on the side-wall and the bottom of said shallow trench to remove damage and decrease leakage; (f) Depositing an oxide layer on said shallow trench and said silicon nitride to fill said shallow trench; (g) planarizing by CMP.

19 Claims, 3 Drawing Sheets

406
402
401
103
102
405
101

MANUFACTURING METHOD OF SHALLOW TRENCH ISOLATION

BACKGROUND OF THE INVENTION

1. Field of the Invention

The present invention relates to a manufacturing method of shallow trench isolation for semiconductor integrated circuits and more particularly to a method by depositing SiON anti-reflective layers with different extinction coefficient (k) to decrease the effect on exposure of the silicon nitride ($Si_3N_4$) and control the width of the window, then the critical dimension (CD) of the active area can be controlled and the filling capability can be improved.

2. Description of Relative Prior Art

The manufacturing technology of integrated circuit is developing smaller and smaller according to Moore's law. The size of a chip is also continuously decreasing because of the increasing of integrity to increase the device number per unit area of a chip. The critical dimension of semiconductor is shrinking from sub-micron to nanometer (nm). Most of the exposure light source is 248 $\mu$m, even 193 $\mu$m of wave length for increasing resolution. As the dimension of devices is decreased, it still needs isolation from each other. Isolation technology has developed from LOCOS technology to shallow trench isolation (STI). STI has the advantages of small isolation area and better planarization, especially by using chemical mechanical polishing (CMP) technology, the planarization become more ideal. The traditional STI technology is shown in FIG. 1. FIG. 1 is the cross sectional view of STI process. First, a layer of pad oxide 102 is grown on a silicon substrate 101, a layer of silicon nitride 103 is deposited on said pad oxide 102; Then, as shown in FIG. 1B, a designated thickness of silicon oxy-nitride (SiON) 104 is deposited, in FIG. 1C, using a STI mask to expose the photo-resist for etching the trench. However, the extinction coefficient of the silicon oxy-nitride is nearly zero under the 248 $\mu$m or 193 $\mu$m exposure light source, so the reflectivity of SiON 104 is easily affected by the thickness variation of the silicon nitride layer 103 under it, and the opening or window of the photo-resist 105 is not enough after developed, and the critical dimension of ADI (after development inspection) has too much variation, the critical dimension of the active area (AA) can not be controlled. This will affect the performance and yield of the chip. After refilling of silicon dioxide layer 107 into the trench, planarization becomes worse because of high aspect ratio. This also formed voids 108, which will affect isolation capability, as shown in FIG. 1E.

FIG. 2 shows the reflectivity 201 versus the thickness of $Si_3N_4$ 103 with a normal SiON on the $Si_3N_4$. From curve 201 of FIG. 2, the reflectivity has a minimum of 0.025 for a thickness of 930 Å of silicon nitride 103. The reflectivity is increasing linearly with increasing thickness of the silicon nitride 103. Thus the thickness of silicon nitride affects the reflectivity, and that a normal SiON can not be effectively used as anti-reflected material. After development inspection, the CD will be changed, results a variable trench width after etching, and will have not enough width of the opening.

The curve 301 in FIG. 3 shows the ADI size for different thickness of silicon nitride 103. From curve 301 of FIG. 3, for a silicon nitride thickness of 910 Å, the ADI size is 0.146 $\mu$m; for a silicon nitride thickness of 950 Å, the ADI size is 0.16 $\mu$m. Therefore, if the thickness between wafer to wafer or within a wafer is not uniform, the ADI for different wafers or different position of a wafer will not be the same, and is then affect the performance of devices or yield of the product.

SUMMARY OF THE INVENTION

Accordingly, the manufacturing method of shallow trench isolation of the prior art cannot control the critical dimension (CD) of ADI after development, the width of the trench after etching cannot be control. One object of the present invention is to provide a manufacturing method of shallow trench isolation for controlling the critical dimension of the active area (AA).

Another object of the present invention is to provide a manufacturing method of shallow trench isolation by providing two or three layers of hard mask. The upper layer of hard mask has a pull back effect after etching, such that the upper opening of the trench becomes wider, and the filling capability can be improved.

In order to accomplish the above objects, one embodiment of the present invention teaches a manufacturing method of shallow trench isolation for decreasing the effect of silicon nitride ($Si_3N_4$) thickness to the reflectivity of the $Si_3N_4$, and controlling the critical dimension of the active area of the transistors, comprising: (a) Depositing pad oxide/silicon nitride on a substrate as a hard mask for etching; (b) Depositing a layer of high extinction coefficient SiON on said silicon nitride, then depositing a layer of low extinction coefficient SiON as the ARC; (c) Exposing by using a STI mask and developing to form an etching mask of said STI; (d) Etching said SiON, silicon nitride, pad oxide and said substrate to form a shallow trench; (e) Growing an oxide layer on the side-wall and the bottom of said shallow trench to remove damage and decrease leakage; (f) Depositing an oxide layer on said shallow trench and said silicon nitride to fill said shallow trench; (g) Planarizing by CMP.

Another embodiment of the present invention teaches a manufacturing method of a shallow trench isolation, comprising: (a) Depositing pad oxide/silicon-nitride on a substrate as a hard mask for etching; (b) first, depositing a high extinction coefficient silicon oxy-nitride (SiON) layer on the silicon nitride ($Si_3N_4$) layer to a desired thickness, then changing the flow rate of silane ($SiH_4$) and $N_2O$ gradually to decrease the extinction coefficient to 0.3, and then keeping the flow rate of silane and $N_2O$, continue to deposit said low extinction coefficient silicon oxy-nitride (SiON) to a desired thickness; (c) Exposing by using a STI mask and developing to form an etching mask of said STI; (d) Etching said silicon oxy-nitride (SiON), silicon nitride, pad oxide and said substrate to form a shallow trench; (e) Growing an oxide layer on the side wall and the bottom of said shallow trench to remove damage and decrease leakage; (f) depositing an oxide layer on said shallow trench and said silicon nitride to fill said shallow trench; (g) Planarizing by chemical mechanical polishing (CMP).

DETAIL DESCRIPTION OF THE PRESENT INVENTION

Figure 1:
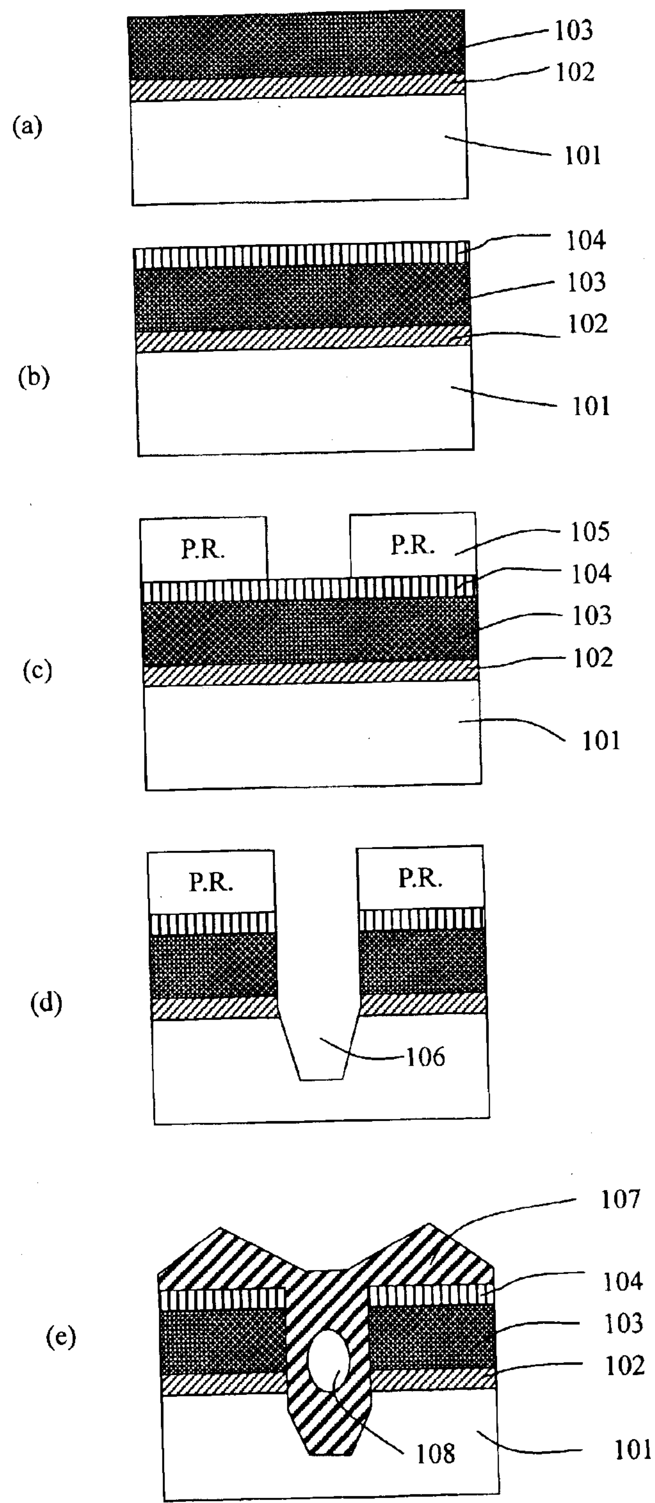
FIG. 1 is the cross sectional view of STI process.

Reference should now be made to the drawing, in which the same reference numerals are used through out the different drawings to designate the same or similar component.

Figure 4:
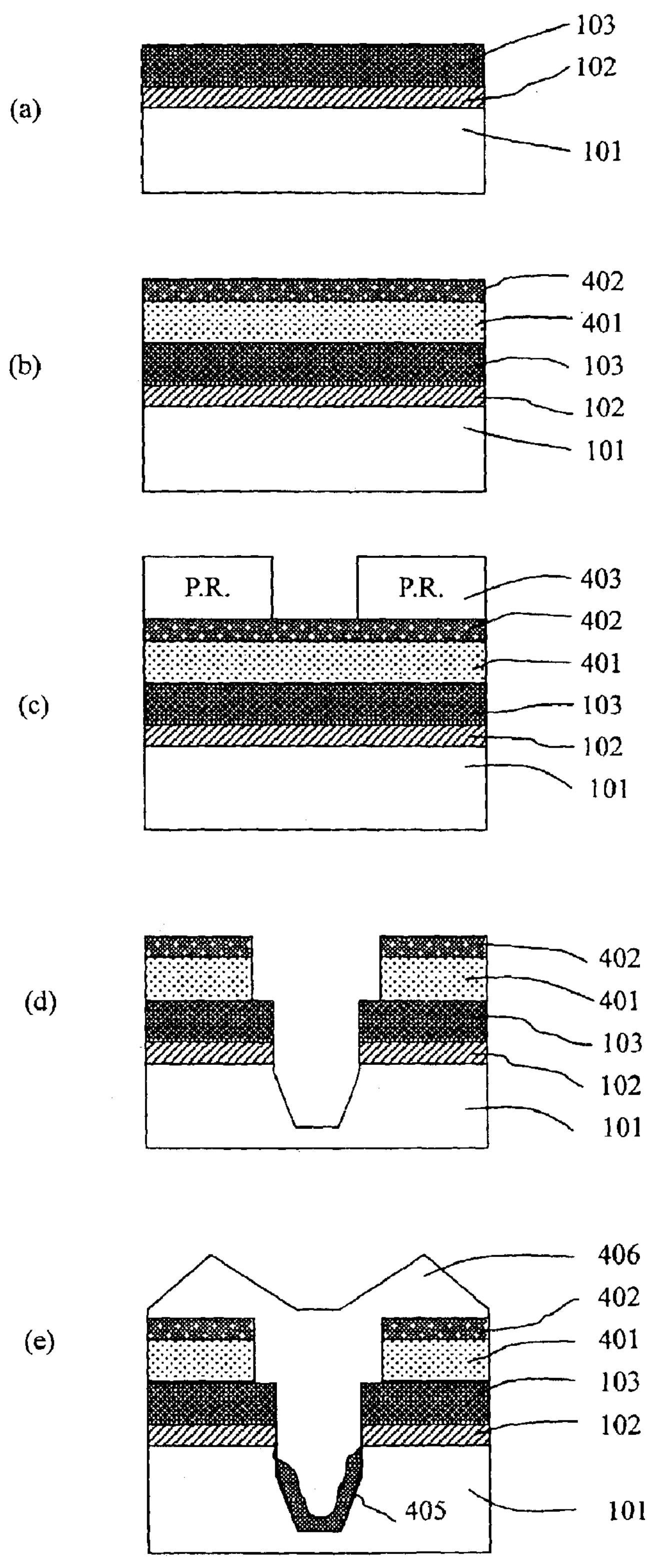
FIG. 4 is a cross sectional view of the manufacturing step according to the first preferred embodiment of the present invention.

FIG. 4 is a cross sectional view of the manufacturing step according to the first preferred embodiment of the present invention. FIG. 4A illustrates a layer of pad oxide 102 is grown by dry oxidation on a silicon substrate 101 with thickness of 50 Å to 200 Å in order to decrease the defect on the silicon, and decreasing the stress of silicon nitride 103 deposited in the following step. Then a layer of silicon nitride 103 is deposited by LPCVD or PECVD on said pad oxide 102, the thickness is 500 Å to 2000 Å, to be the hard mask for shallow trench etching.

Refer to FIG. 4B, FIG. 4B illustrates depositing a layer of high extinction coefficient silicon oxy-nitride 401 on said silicon nitride 103, then a layer of low extinction coefficient silicon oxy-nitride 401 is deposited to form an anti-reflection layer. The method for deposition high extinction coefficient silicon oxy-nitride, for example, using plasma enhanced CVD (PECVD) method, using silane ($SiH_4$) and $N_2O$ as the gas source, the temperature keeps from 300° C. to 450° C., The pressure at depositing is about 2 torr to 3.5 torr. For high extinction coefficient silicon oxy-nitride deposition, the gas flow rate of silane is 200 sccm to 350 sccm, $N_2O$ flow rate is 50 sccm to 200 sccm. By adjusting the flow rates of silane and $N_2O$, the extinction coefficient can be changed. For example, said low extinction coefficient of silicon oxy-nitride can be obtained by adjusting the flow rate of silane from 150 sccm to 250 sccm, $N_2O$ from 350 sccm to 500 sccm.

Figure 2:
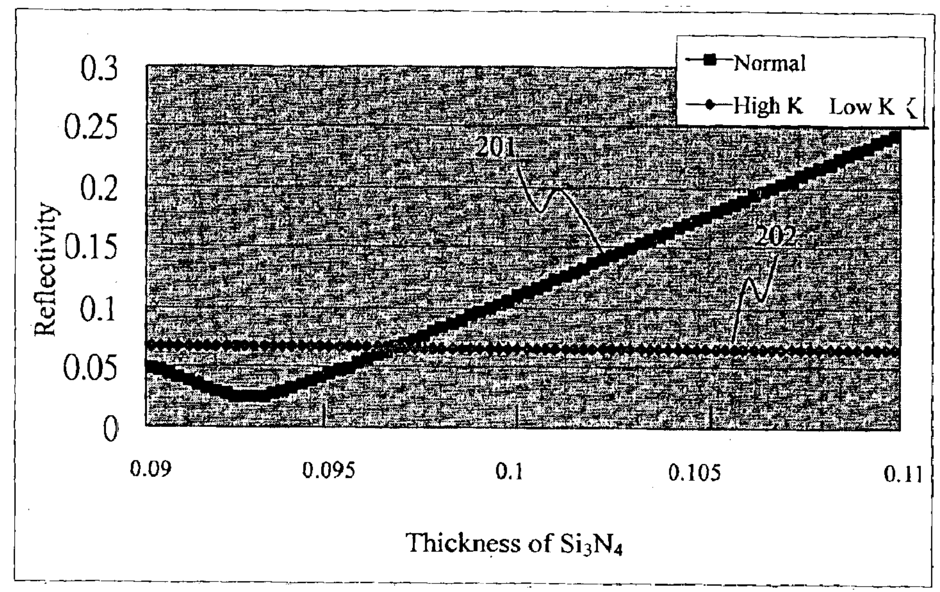
FIG. 2 shows the reflectivity versus the thickness of silicon nitride.
Figure 3:
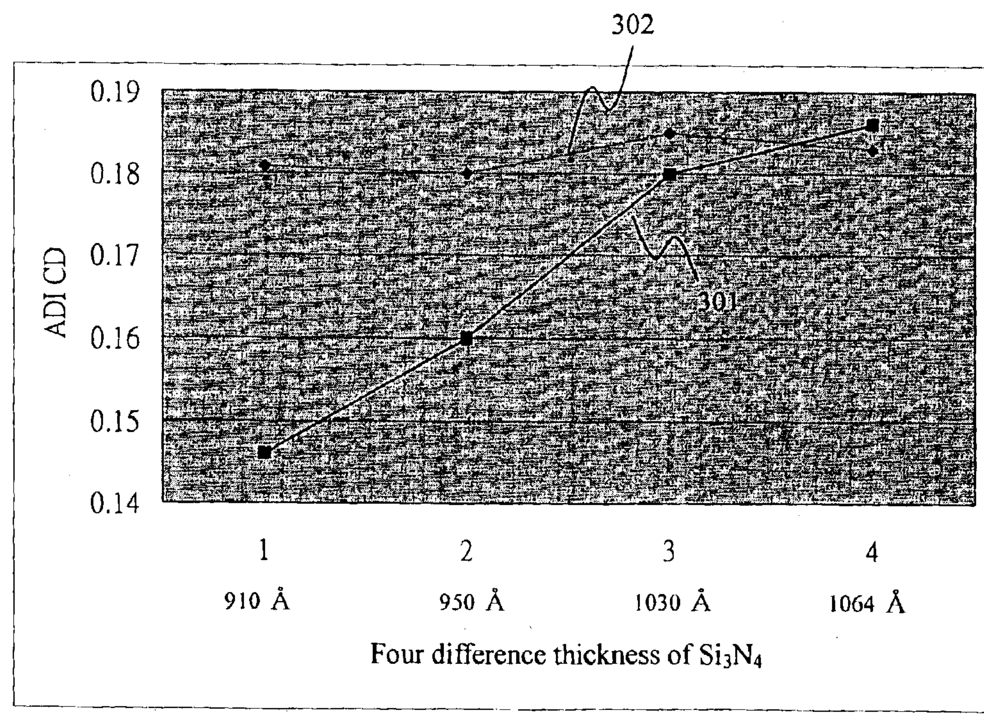
FIG. 3 shows the ADI size for different thickness of silicon nitride.

FIG. 4C illustrates the process of coating a layer of photo-resist on the low extinction coefficient silicon oxy-nitride 402, after exposure and developing the photo-resist to form an etching mask 403 of the shallow trench. In using 248 nm and 193 nm wave length of light source for exposure, the existing of said high extinction coefficient silicon oxy-nitride 401 and said low extinction coefficient silicon oxy-nitride 402, although the thickness of the nearly zero extinction coefficient of said silicon nitride 103 is changed, the reflective coefficient will not change. Now refer back to FIG. 2, curve 202 is the reflective coefficient of depositing a high extinction coefficient silicon oxy-nitride layer 401 and a low extinction coefficient silicon oxy-nitride layer 402 on said silicon nitride 103, versus the thickness of silicon nitride 103. From this curve, we can see a fixed reflective coefficient of 0.07, and is not changed with the thickness of silicon nitride. As compare to the curve 201 of FIG. 2, with only one layer of the prior art extinction coefficient silicon oxy-nitride 104 (refer to FIG. 1), the reflective coefficient is changed with the thickness of silicon nitride 103. Now refer to FIG. 3, the curve 302 of FIG. 3 shows the anti-reflective layer made from a high extinction coefficient silicon oxy-nitride 401 and a low extinction coefficient silicon oxy-nitride 402, the critical dimension of the shallow trench opening of window will keep at a constant value after the shallow trench has developed for ADI (after development inspection). As compare to the curve 301 of FIG. 3, by using only a prior art silicon oxy-nitride layer 104 (refer to FIG. 1) as the anti-reflective layer, the shallow trench opening will change with the thickness of said silicon nitride layer 104, and the critical dimension of the shallow trench will out of control.

Coming back to FIG. 4, FIG. 4D shows the opening of the anti-reflective layer and the trench after etching. Etching is performed, for example, by using dry etching. During etching, the etching rate of said anti-reflective layer 401 and 402 is faster than that of silicon nitride layer 103 and silicon substrate 101, then results pull back, and the opening of said anti-reflective layer 401, 402 is wider than that of said silicon nitride 103. Therefore, is helpful for filling silicon dioxide layer 406 into the trench without void in the trench, and increasing yield and decreasing leakage current.

Refer to FIG. 4E. FIG. 4E shows the result of filling silicon dioxide into the shallow trench. First, growing a layer of silicon dioxide 405 on the bottom and the side-wall of the shallow trench to eliminate the etching damages, and then depositing silicon dioxide 406 into the shallow trench. The deposition of silicon dioxide is using, for example, high density plasma CVD (HDPCVD) by using oxygen ($O_2$) and silane ($SiH_4$) as the reaction gas, and periodically bombard with argon plasma to planarize the surface. Shallow trench is completed at this step.

A second preferred embodiment of the present invention is almost the same as the first embodiment except that the deposition method of high extinction coefficient silicon oxy-nitride and low extinction silicon oxy-nitride is different. The first embodiment of the present invention deposited the anti-reflective layer by a two-step method: first, deposited said high extinction coefficient silicon oxy-nitride; second, deposited said low extinction coefficient silicon oxy-nitride. The second embodiment of the present invention deposited the anti-reflected layer in one step, that is, after the wafer is loaded into the deposition chamber, the deposition is carried out by depositing high extinction coefficient silicon oxy-nitride using high flow rate of silane and low flow rate of $N_2O$, then slowly decreasing the flow rate of silane and increasing the flow rate of $N_2O$ to increase the nitrogen contain of the silicon oxy-nitride, then the silicon oxy-nitride will change from high extinction coefficient to low extinction coefficient linearly.

Although specific embodiments of the invention have been disclosed, it will be understood by those having skill in the art that minor changes can be made to the form and details of the specific embodiments disclosed herein, without departing from the spirit and the scope of the invention. The embodiments presented above are for purposes of example only and are not to be taken to limit the scope of the appended claims.

What is claimed is:

1. A manufacturing method of shallow trench isolation, comprising:

(a) depositing pad-oxide/silicon-nitride on a substrate as a hard mask for etching;

(b) depositing a layer of high extinction coefficient silicon oxy-nitride (SiON) on said silicon nitride, then depositing a layer of low extinction coefficient silicon oxy-nitride (SiON) as the anti-reflective coating (ARC);

(c) exposing by using a STI mask and developing to form an etching mask of said STI;

(d) etching said silicon oxy-nitride (SiON), silicon nitride, pad oxide and said substrate to form a shallow trench;

(e) growing an oxide layer on the side wall and the bottom of said shallow trench to remove damage and decrease leakage;

(f) depositing an oxide layer on said shallow trench and said silicon nitride to fill said shallow trench;

(g) planarizing by chemical mechanical polishing (CMP).

2. The manufacturing method of claim 1, wherein the thickness of said pad oxide is 50 Å to 200 Å.

3. The manufacturing method of claim 1, wherein the thickness of said silicon nitride ($Si_3N_4$) is 500 Å to 2000 Å.

4. The manufacturing method of claim 1, wherein said high extinction coefficient silicon oxy-nitride (SiON) is deposited by PECVD method by control the flow rate of silane ($SiH_4$) from 200 sccm to 350 sccm and the flow rate of $N_2O$ from 50 sccm to 200 sccm.

5. The manufacturing method of claim 1, wherein said low extinction coefficient silicon oxy-nitride (SiON) is deposited by plasma enhanced chemical vapor deposition (PECVD) method by control the flow rate of silane ($SiH_4$) from 150 sccm to 250 sccm and the flow rate of $N_2O$ from 350 sccm to 500 sccm.

6. The manufacturing method of claim 1, wherein the extinction coefficient (k value) of said high extinction coefficient silicon oxy-nitride (SiON) is larger than 1.2; the thickness of said high extinction coefficient silicon oxy-nitride (SiON) is 200 Å to 2000 Å.

7. The manufacturing method of claim 1, wherein the extinction coefficient (k value) of said low extinction coefficient silicon oxy-nitride (SiON) is 0.2 to 0.4; the thickness of said low extinction coefficient silicon oxy-nitride (SiON) is 200 Å to 500 Å.

8. The manufacturing method of claim 1, wherein the etching depth of the shallow trench is 2500 Å to 5000 Å.

9. The manufacturing method of claim 1, wherein the growing method of silicon nitride on the bottom and sidewall of the trench is dry oxidation.

10. The manufacturing method of claim 1, wherein filling said silicon dioxide into said shallow trench is by high-density plasma CVD (HDPCVD) by using oxygen ($O_2$) and silane ($SiH_4$) as the reaction gas, and by periodically bombard with argon (Ar) plasma to planarize the surface.

11. A manufacturing method of shallow trench isolation, comprising:

(a) depositing pad oxide/silicon-nitride on a substrate as a hard mask for etching;

(b) begin to deposit a high extinction coefficient silicon oxy-nitride (SiON) layer on the silicon nitride ($Si_3N_4$) layer to a desired thickness, then changing the flow rate of silane and $N_2O$ gradually to decrease the extinction coefficient to 0.3, and then keeping the flow rate of silane and $N_2O$, continue to deposit said low extinction coefficient silicon oxy-nitride (SiON) to a desired thickness;

(c) exposing by using a STI mask and developing to form an etching mask of said STI;

(d) etching said silicon oxy-nitride (SiON), silicon nitride, pad oxide and said substrate to form a shallow trench;

(e) growing an oxide layer on the side wall and the bottom of said shallow trench to remove damage and decrease leakage;

(f) depositing an oxide layer on said shallow trench and said silicon nitride to fill said shallow trench;

(g) planarizing by chemical mechanical polishing (CMP).

12. The manufacturing method of claim 11, wherein the thickness of said pad oxide is 50 Å to 200 Å.

13. The manufacturing method of claim 11, wherein the thickness of said silicon nitride ($Si_3N_4$) is 500 Å to 2000 Å.

14. The manufacturing method of claim 11, wherein said silicon oxy-nitride (SiON) is deposited by PECVD method, by controlling the flow rate of silane between 200 sccm to 350 sccm, and the flow rate of $N_2O$ between 50 sccm to 200 sccm to deposit said high extinction coefficient silicon oxy-nitride (SiON) layer to a desired thickness, then change the flow rate gradually to a flow rate of silane between 150 sccm to 250 sccm, a flow rate of $N_2O$ between 350 sccm to 500 sccm to change the silicon oxy-nitride (SiON) to said low extinction coefficient silicon oxy-nitride (SiON).

15. The manufacturing method of claim 11, wherein the extinction coefficient (k value) of said high extinction coefficient silicon oxy-nitride (SiON) is larger than 1.2; the thickness of said high extinction coefficient silicon oxy-nitride (SiON) is 200 Å to 2000 Å.

16. The manufacturing method of claim 11, wherein the extinction coefficient (k value) of said low extinction coefficient silicon oxy-nitride (SiON) is 0.2 to 0.4; the thickness of said low extinction coefficient silicon oxy-nitride (SiON) is 200 Å to 500 Å.

17. The manufacturing method of claim 11, wherein the etching depth of the shallow trench is 2500 Å to 5000 Å.

18. The manufacturing method of claim 11, wherein the growing method of silicon nitride on the bottom and sidewall of the trench is dry oxidation.

19. The manufacturing method of claim 11, wherein filling said silicon dioxide into said shallow trench is by high-density plasma CVD (HDPCVD) by using oxygen ($O_2$) and silane ($SiH_4$) as the reaction gas, and by periodically bombard with argon (Ar) plasma to planarize the surface.

* * * * *